United States Patent [19]

Hutchings et al.

[11] Patent Number: 5,352,915
[45] Date of Patent: Oct. 4, 1994

[54] SEMICONDUCTOR COMPONENT HAVING TWO INTEGRATED INSULATED GATE FIELD EFFECT DEVICES

[75] Inventors: Keith M. Hutchings, Groombridge; Andrew L. Goodyear, Redhill; Paul A. Gough, Smallfield, all of England

[73] Assignee: U.S. Philips Corporation, New York, N.Y.

[21] Appl. No.: 103,943

[22] Filed: Aug. 9, 1993

[30] Foreign Application Priority Data

Aug. 11, 1992 [GB] United Kingdom ............... 9216953

[51] Int. Cl.[5] .................. H01L 29/10; H01L 29/78
[52] U.S. Cl. ................... 257/361; 257/328; 257/363; 257/335
[58] Field of Search ............... 257/328, 360, 361, 362, 257/363, 335, 336

[56] References Cited

U.S. PATENT DOCUMENTS

| 4,573,066 | 2/1986 | Whight ............... 257/495 |
| 4,707,719 | 11/1987 | Whight ............... 257/489 |
| 4,767,722 | 8/1988 | Blanchard ............ 437/41 |
| 4,774,560 | 9/1988 | Coe .................. 257/495 |
| 5,072,266 | 12/1991 | Bulucea et al. ....... 257/330 |

OTHER PUBLICATIONS

"A New Vertical Sidewall Channel Power Mosfet With Rectangular Grooves" Ueda et al, Extended Abstracts of the 16th (1984 International) Conference on Solid State Devices and Materials, Kobe, 1984, pp. 313–316.

*Primary Examiner*—Andrew J. James
*Assistant Examiner*—John Guay
*Attorney, Agent, or Firm*—Steven R. Biren

[57] ABSTRACT

A semiconductor component (1a) has first and second insulated gate field effect devices (T1 and T2) formed within the same seminconductor body (2). The devices (T1 and T2) have a common first main electrode (D) and an arrangement (20) provides a resistive connection (20b) between a second main electrode (S2)of the second device (T2) and the insulated gate (G1) of the first device (T1). The second device (T2) is formed so as to be more susceptible than the first device (T1) to parasitic bipolar transistor action for causing, when the first and second devices (T1 and T2) are turned off and a voltage exceeding a critical voltage (V$_c$) is applied to the common first main electrode (D), the parasitic bipolar transistor (B) within the second device (T2) to turn on producing a current for causing, by virtue of the resistive connection (20b) between the second main electrode (S2) of the second device (T2) and the insulated gate (G1) of the first device (T1), the voltage at the insulated gage (G1) of the first device (T1) to alter to cause the device (T1) to turn on. This allows the energy of the overvoltage to be dissipated by conduction of the first insulated gate field effect device to avoid any potentially damaging effects, such as irreversible bipolar breakdown or performance degradation due to hot carrier injection into the gate oxide.

12 Claims, 3 Drawing Sheets

SEMICONDUCTOR COMPONENT HAVING TWO INTEGRATED INSULATED GATE FIELD EFFECT DEVICES

BACKGROUND OF THE INVENTION

This invention relates to a semiconductor component, in particular a semiconductor component having an insulated gate field effect device, which is provided with a device for protection against overvoltages such as may occur during the switching of inductive loads.

EP-A-372820 discusses the use of clamping diodes to protect insulated gate field effect devices such as power MOSFETs. EP-A-372820 describes the previous use of a clamping diode connected externally between the gate and drain of a power MOSFET and having an avalanche voltage about two to three volts less than the avalanche voltage of the power MOSFET so that when the drain voltage rises while the power MOSFET is switched off (for example as may occur when switching off an inductive load) and exceeds the avalanche voltage of the clamping diode, the resulting avalanche current causes the gate voltage of the power MOSFET to rise to switch on the power MOSFET and so allow at least part of the energy to be dissipated by conduction of the power MOSFET, thereby avoiding potentially destructive avalanche conditions within the power MOSFET. As an alternative to an externally connected clamping diode, EP-A-372820 proposes the use of a chain of polycrystalline silicon diodes to form the clamping diode. This has the advantage that the polycrystalline silicon diodes can be provided on top of the power MOSFET so that the use of an externally connected diode is avoided. In addition, by providing back-to-back polycrystalline silicon diodes a temperature compensation effect can be achieved. However, the properties of polycrystalline silicon diodes can be very variable and their current-handling capabilities are limited.

SUMMARY OF THE INVENTION

It is an aim of the present invention to provide a semiconductor component comprising an insulated gate field effect device in which protection against overvoltages can be provided within the semiconductor component.

According to one aspect of the present invention, there is provided a semiconductor component comprising first and second insulated gate field effect devices formed within the same semiconductor body, the first and second insulated gate field effect devices having a common first main electrode and means for providing a resistive connection between a second main electrode of the second insulated gate field effect device and the insulated gate of the first insulated gate field effect device, the second insulated gate field effect device being formed so as to be more susceptible than the first insulated gate field effect device to parasitic bipolar transistor action for causing, when the first and second insulated gate field effect devices are turned off and a voltage exceeding a critical voltage is applied to the common first main electrode, the parasitic bipolar transistor within the second insulated gate field effect device to turn on producing a current for causing, by virtue of the resistive connection between the second main electrode of the second insulated gate field effect device and the insulated gate of the first insulated gate field effect device, the voltage at the insulated gate of the first insulated gate field effect device to alter to cause the first insulated gate field effect device to turn on.

Thus, in a semiconductor component in accordance with the invention a second insulated gate field effect device which is inherently more susceptible to parasitic bipolar transistor action is integrated in the same semiconductor body as the first insulated gate field effect device. The second insulated gate field effect device is arranged so that when the first and second insulated gate field effect devices are turned off (i.e. are non-conducting) and the voltage at the first main electrode exceeds a critical voltage, parasitic bipolar action is initiated within the second insulated gate field effect device causing a current to flow which, by virtue of the resistive connection, causes the voltage at the insulated gate of the first insulated gate field effect device to alter, so causing the first insulated gate field effect device to turn on allowing the energy due to the overvoltage to be dissipated by conduction of the first insulated gate field effect device, thereby avoiding or at least reducing any potentially damaging effects, such as irreversible bipolar breakdown or performance degradation.

A semiconductor component in accordance with the invention has the advantage over other protection systems, such as polycrystalline silicon diodes, that the trigger voltage for the protection device is sensitive to the breakdown mechanism which could potentially damage the first insulated gate field effect device.

The first insulated gate field effect device may comprise a first region of one conductivity type providing a conductive path to the first main electrode, a second region of the one conductivity type and a third region of the opposite conductivity type separating the first and second regions and defining therebetween a first conduction channel region adjoining the insulated gate of the first insulated gate field effect device and the second insulated gate field effect device may comprise a fourth region of the one conductivity type connected by the resistive connection providing means to the insulated gate of the first insulated gate field effect device and a fifth region of the opposite conductivity type separating the fourth and first regions and defining therebetween a second conduction channel region adjoining the insulated gate of the second insulated gate field effect device, the fifth and fourth regions being arranged such that the second insulated gate field effect device is more susceptible to parasitic bipolar action than the first insulated gate field effect device for causing the parasitic bipolar transistor defined by the first, fourth and fifth regions to turn on when the voltage at the first main electrode exceeds the critical voltage.

In a preferred example the fifth region provides a more resistive path for charge carriers of the opposite conductivity type than the third region. Thus the third region may be electrically shorted to the second region while the fifth region may provide a conductive path to a separate fourth electrode. The fourth region may have a different geometry from the second region. The resistive paths for charge carriers of the opposite conductivity type within the fifth region may extend beneath the fourth region for a distance greater than the distance extended beneath the second region by the resistive path provided by the third region so making the second insulated gate field effect device far more susceptible than the first to parasitic bipolar transistor action. The critical voltage may in such a case be varied as desired by altering the length of the resistive path through the fifth region which may be achieved simply by an appropriate mask modification. The current carrying capability of the second insulated gate field effect device and the parasitic bipolar transistor provided thereby may be increased by increasing the area (that is the size) of the second insulated gate field effect device.

In another aspect, the present invention provides a semiconductor component comprising a semiconductor body providing a first insulated gate field effect device having a first region of one conductivity type providing a conductive path to a first main electrode, a second region of the one conductivity type, a third region of the opposite conductivity type separating the first and second regions and defining therebetween a first conduction channel region, a first insulated gate adjoining the first conduction channel region for controlling conduction through the first conduction channel region between the first and second regions and a second main electrode connected to the second region and shorting the second region to the third region remote from the first conduction channel region and a second insulated gate field effect device comprising a fourth region of one conductivity type means providing a resistive connection between the fourth region and the first insulated gate, a fifth region of the opposite conductivity type separating the fourth and first regions and defining there between a second conduction channel region, a second insulated gate adjoining the second conduction channel region and a fourth electrode connected to the fifth region for providing a conductive path for charge carriers of the opposite conductivity type through the fifth region bypassing the fourth region, the resistance of the conductive path through the fifth region being such that when the first and second insulated gate field effect devices are turned off and a voltage exceeding a critical voltage is applied to the first main electrode, the flow of opposite conductivity type charge carriers along the conductive path through the fifth region causes the parasitic bipolar transistor formed by the fourth, fifth and first regions to turn on producing a current for causing, by virtue of the resistive connection between the second main electrode of the second insulated gate field effect device and the insulated gate of the first insulated gate field effect device, the voltage at the insulated gate of the first field effect device to alter to cause the first insulated gate field effect device to turn on.

The first insulated gate field effect device may comprise a plurality of parallel-connected insulated gate field effect device cells each comprising a second region of the one conductivity type separated from the first region by a third region of the opposite conductivity type defining a conduction channel region adjoining an insulated gate.

The insulated gates may be provided on the walls of trenches extending through the third and fifth regions.

The third and fifth regions may be integrally formed as a continuous layer.

In one example of a semiconductor component in accordance with the invention, the insulated gates may be provided on the walls of trenches extending through the third and fifth regions, respectively, and the fourth region may extend laterally beyond the second insulated gate for a distance greater than the distance for which the second region extends laterally beyond the first insulated gate so that the resistance of the conductive path through the fifth region to the fourth main electrode is greater than that of the conductive path through the third region to the second main electrode.

Preferably, the means providing the resistive connention between the second main electrode of the second insulated gate field effect device and the insulated gate of the first insulated gate field effect device comprises a gate drive arrangement for the insulated gate of the first insulated gate field effect device.

BRIEF DESCRIPTION OF THE DRAWING

Embodiments of the invention will now be described, by way of example, with reference to the accompanying drawing, in which.

Figure 1:
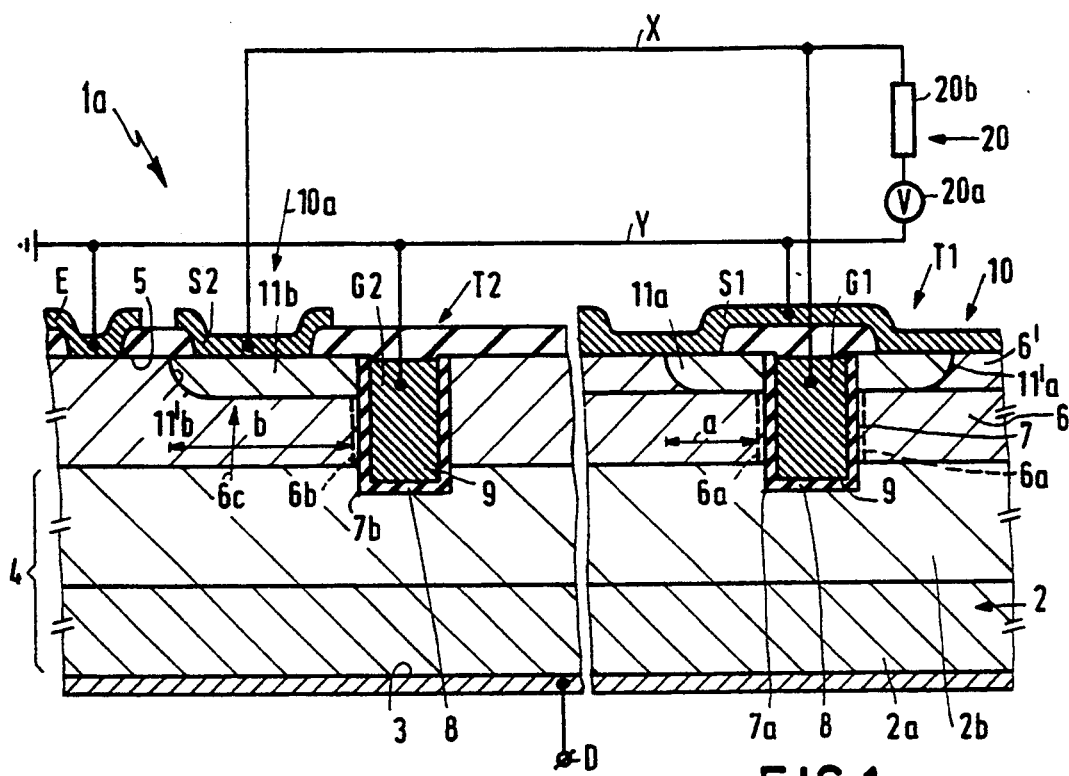
FIG. 1 is a cross-sectional view, part broken away, through part of one embodiment of a semiconductor component in accordance with the invention.

It should be understood that the Figures are merely schematic and are not drawn to scale. In particular certain dimensions such as the thickness of layers or regions may have been exaggerated while other dimensions may have been reduced. It should also be understood that the same reference numerals are used throughout the Figures to indicate the same or similar parts.

DESCRIPTION OF THE PREFERRED EMBODIMENTS

Referring now to the drawings, there are illustrated various examples $1a$, $1b$, $1c$ of semiconductor components in accordance with the invention.

A semiconductor component for example the semiconductor component $1a$ illustrated in FIG. 1, in accordance with the invention comprises first and second insulated gate field effect devices T1 and T2 formed within the same semiconductor body 2, the first and second insulated gate field effect devices T1 and T2 having a common first main electrode D and means 20 providing a resistive connection $20b$ between a second main electrode S2 of the second insulated gate field effect device T2 and the insulated gate G1 of the first insulated gate field effect device T1, the second insulated gate field effect device T2 being formed so as to be more susceptible than the first insulated gate field effect device T1 to parasitic bipolar transistor action for causing, when the first and second insulated gate field effect devices T1 and T2 are turned off and a voltage exceeding a critical voltage $V_c$ is applied to the common first main electrode D, the parasitic bipolar transistor B within the second insulated gate field effect device T2 to turn on producing a current for causing, by virtue of the resistive connection $20b$ between the second main electrode S2 of the second insulated gate field effect device T2 and the insulated gate G1 of the first insulated gate field effect device T1, the voltage at the insulated gate G1 of the first insulated gate field effect device T1 to alter to cause the first insulated gate field effect device T1 to turn on.

Thus, in a semiconductor compoment 1a, 1b, 1c in accordance with the invention, a second insulated gate field effect device T2 which is inherently more susceptible to parasitic bipolar transistor action than the first insulated gate field effect device T1 is integrated in the same semiconductor body 2 as the first insulated gate field effect device T1. The second insulated gate field effect device T2 is arranged so that when the voltage at the first main electrode D exceeds a critical voltage $V_c$, for example during the switching of an inductive load, the parasitic bipolar transistor B within the second insulated gate field effect device T2 is turned on causing a current to flow which in turn results, by virtue of the resistive connection 20b of the second main electrode S2 of the second insulated gate field effect device T2 to the insulated gate G1 of the first insulated gate field effect device 1, in a change, an increase in the case of an n-channel first insulated gate field effect device, in the voltage at the insulated gate G1 causing the first insulated gate field effect device T1 to turn on allowing the energy of the overvoltage to be dissipated by conduction of the first insulated gate field effect device to avoid any potentially damaging effects, such as irreversible bipolar breakdown or performance degradation due to hot carrier injection into the gate oxide, of the first insulated gate field effect device T1. Such a device has advantages over other protection systems which use external components such as polycrystalline silicon diodes because the trigger voltage for the protection device formed by the second insulated gate field effect device T2 is sensitive, indeed dependent, on the same breakdown mechanism which could otherwise potentially damage the first insulated gate field effect device T1.

Various examples of semiconductor components in accordance with the invention will now be described. FIG. 1 illustrates, by way of a cross-sectional view, part of a semiconductor component 1a in which the first and second insulated gate field effect devices T1 and T2 area n-channel insulated gate field effect transistors (IGFETs) of the so-called Trenchfet type as described in for example U.S. Pat. No. 4,767,722 and papers by Ueda et al of Matsushita Electronics Corporation for example the paper published in the extended abstracts of the 16th (1984 International) Conference on Solid State Devices and Materials, Kobe 1984 at pages 313-316 entitled 'a new vertical sidewall channel power MOSFET with rectangular grooves'. In such an IGFET, the insulated gates are formed within grooves or trenches extending into the semiconductor body 2.

Referring now specifically to the example illustrated in FIG. 1, the semiconductor body 2 comprises a relatively highly doped monocrystalline silicon substrate 2a to which the first main electrode D makes ohmic contact at one major surface 3 of the semiconductor body 2. A relatively lowly doped epitaxial silicon layer 2b is provided on the substrate 2b. In this example, the substrate 2a and epitaxial layer 2b are both of the one conductivity type, n conductivity type in this case, and together form a common first or drain region 4 of the IGFETs T1 and T2.

A blanket implant, generally through a sacrificial oxide and typically using boron ions with a dose of $2-3 \times 10^{13}$ ions $cm^{-2}$ and an energy of 60 keV, and subsequent diffusion of impurities of the opposite conductivity type, p conductivity type in this case, at the other major surface 5 of the semiconductor body 2 provides a channel-defining region 6 which in this example is common to both the first and second IGFETs T1 and T2. Trenches 7 for the insulated gates G1 and G2 of the first and second IGFETs T1 and T2 are formed through the channel-defining region 6 to extend just into the epitaxial layer or drain drift region 2b.

A thermally grown gate oxide layer 8 is provided on the walls of the trenches 7 and the trenches are filled with conductive material, generally doped polycrystalline silicon, which will define the gate conductive regions 9 of the IGFETs T1 and T2. Source regions 11a and 11b for the IGFETs T1 and T2, respectively, are defined by masking the surface 5 appropriately and implanting and/or diffusing impurities of the one conductivity type, n conductivity type in this example and typically arsenic ions with a dose of $5 \times 10^{15}$ ions $cm^{-2}$ and an energy of 80 keV.

The portions of the region 6 adjoining the insulated gates G1 and G2 define conduction channel regions 6a and 6b (illustrated by dashed lines in FIG. 1). As is well known by those skilled in the art, the application of a voltage above a threshold voltage to such an insulated gate will result in an inversion of the conduction channel region defining a conduction channel for the flow of charge carriers between source and drain.

As illustrated in FIG. 1, the source regions 11a and 11b are defined such that there is a source region 11a on each side of the insulated gate G1 of the IGFET T1 but the source region 11b of the second IGFET T2 extends only on the side of the insulated gate G2 remote from the first IGFET T1. The second IGFET T2 could be symmetrical about the insulated gate G2 so that the insulated gate is surrounded by the source region 11a or could be bounded by an annular insulated gate G2 within which the source region 11b similarly defines an annulus so that part of the region 6 reaches the surface 5 inside the source region 11b, or any other suitable geometry would be used.

An important difference between the source regions 11a and 11b is that the lateral extent, that is the extent parallel to the major surface 5, of the source region 11b of the second IGFET T2 is greater than that of the first IGFET T1. Thus, as illustrated in FIG. 1, the source region 11a extends laterally beyond the trench wall of the associated insulated gate G1 for a distance a while the source region 11b extends laterally beyond the trench wall of the associated insulated gate G2 for a distance b greater than a. These distances will normally be those defined by the mask windows of the mask used to form the source region 11a and 11b. The reasons for these different distances will be explained below.

An insulating layer, for example silicon oxide, 12 on the major surface 5 is formed with contact windows and metallization for example aluminium deposited and patterned to define a second main electrode which forms the source electrode S1 of the first IGFET T1 which electrically shorts the source region 11a to the channel-defining region 6, a third main electrode which forms the source electrode S2 of the second IGFET T2 and a fourth main electrode E which makes electrical contact with the channel-defining region 6 adjacent but spaced from the source region 11b remote from the insulated gate G2.

Although not shown, the metallization also defines electrodes making connection via appropriate contact windows with the insulated gates G1 and G2. A first electrical connection X is provided between the source electrode S2 of the second IGFET T2 and the insulated gate G1 of the first IGFET T1 and a separate electrical connection Y between the fourth main electrode E, the insulated gate G2 of the IGFET T2 and the source electrode S1 of the first IGFET T1. The first and second electrical connections X and Y are generally external wire connections but would possibilly, at least in part, be provided by patterning of the metallization. The second electrical connection Y is, in this example, connected to earth (ground). Although it is preferred, the insulated gate G2 to need not necessarily be connected to the source electrode S1 but may be connected to any suitable reference potential which inhibits turn-on of the secound insultated gate field effect device T2 when the first insulated gate field effect device T1 is turned off. Indeed it might be possible for the insulated gate G2 to be connected to the insulated gate G1.

In this example the resistive connection providing means 20 comprises a gate drive circuit in the form of a voltage source 20a having a series resistance 20b. The voltage source 20a may be any conventional voltage source suitable for providing the gate drive to the first insultated gate field effect device T1. The series resistance 20b may be simply provided by the voltage source 20a internal resistance when this is of the region of 50 Ohms or may be an additional resistor which supplements the series resistance of the voltage source 20a. The effective resistance of the gate drive circuit 20 and thus the voltage applied to the gate G1 for a given current flow through the parasitic bipolar B could be adjusted as desired by the incorporation of additional resistors, for example a resistor in parallel with the gate drive circuit 20 could be used to reduce the overall resistance or a resistor could be provided between the emitter of the parasitic bipolar transistor B and the gate drive circuit 20 so as to increase the overall resistance.

The first IGFET T1 is in this example a power semiconductor device capable of handling high source drain currents and will consist of many hundreds of parallel-connected insulated gate field effect device cells 10.

Figure 2:
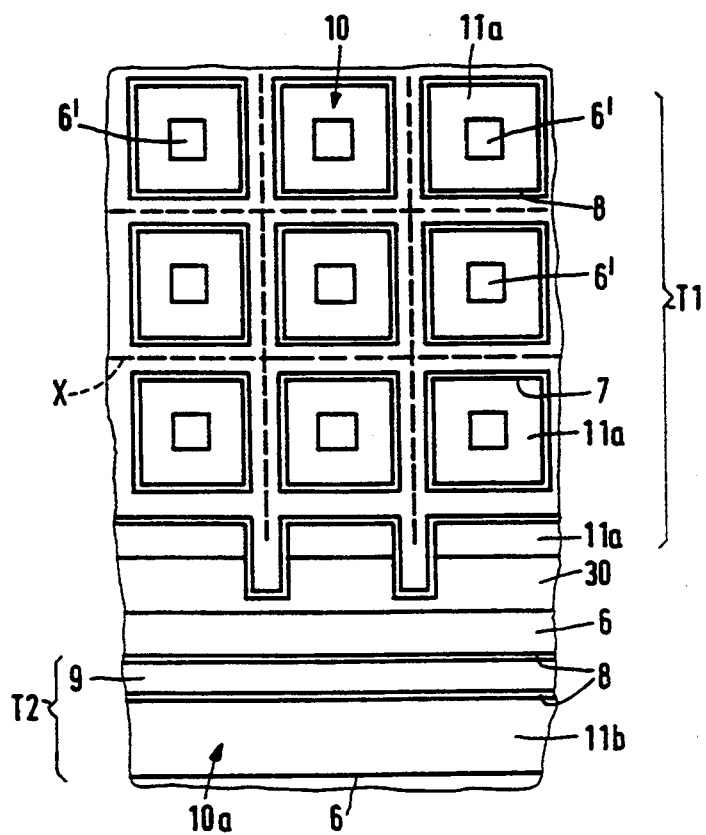
FIG. 2 is a top plan view of part of a semiconductor component in accordance with the invention similar to that shown in FIG. 1 but with the metallization omitted.

The first and second IGFETs T1 and T2 may have any desired geometry when viewed in plan. FIG. 2 illustrates a top plan view of part of a semiconductor component similar to that shown in FIG. 1 with the top metallization omitted to show an example of a typical geometry. Here, the insulated gate G1 of the first IGFET T1 defines a regular mesh, in the example shown a square mesh although other patterns of mesh for example hexagonal or rectangular could be used, which defines the device cells 10. The insulated gate G1 need not form a regular grid or mesh but could have, for example, the form of a number of parallel insulated gate rows connected by the subsquent metallisation or any other suitable arragement. Generally, the insulated gate G1 will form a regular or uniform array but this need not necessarily be the case.

For consistency with planar device, that is DMOS, technology and as seems logical when FIG. 2 is considered, each device cell 10 of the IGFET T1 is herein defined as being bounded by the insulated gate G1 so that each cell 10a has a notional boundary along a longitudianl centre line of the trench as indicated by the dashed line X in FIG. 2.

As is evident from FIG. 1, the trench insulated gate G1 divides the channel-defining region 6 into separate sections. The source regions 11a are formed using a planar technology process so that, as most clearly shown in FIG. 2, each source region 11a has an outer periphery defined by the trench and an inner periphery forming with the region 6a pn junction 11'a meeting the surface 5. An area 6' of each region 6 is thus exposed in the centre of each cell 10. These areas 6' may have their doping levels increased as shown in FIG. 1, by the introduction of further impurities of the opposite conductivity type, to facilitate ohmic connection by the source electrode S1 to the region 6. Generally, the areas 6' are formed by implanting boron ions with an energy of 45–100, say 70, keV and a dose of typically $1 \times 10^{15}$ ions cm$^{-2}$ so that the source region 11a are not over-doped by the area 6' which may be formed before or after the source region 11a.

It will be appreciated by those skilled in the art that the periphery of the first insultated gate field effect device will, especially where the device is a power device, have a field relief edge termination system. The edge termination system may be similar to that described in U.S. Pat. No. 5,072,266 and may, for example, comprise a relatively deep p conductivity type guard ring 30 which envelopes the outermost corners of the grid-like trench 7 containing the insulated gate structure G1 as illustrated schematically in FIG. 2. The guard ring 30 may have a field relief electrode (not shown) extending from the guard ring 30 out onto field oxide (not shown) surrounding the insulated gate field effect device. For higher breakdown voltage devices, say 800 or 1000 or more volt devices, the edge termination system may include one or more field relief semiconductor rings as described in, for example, U.S. Pat. Nos. 4,573,066, 4,774,560 or 4,707,719.

Figure 3:
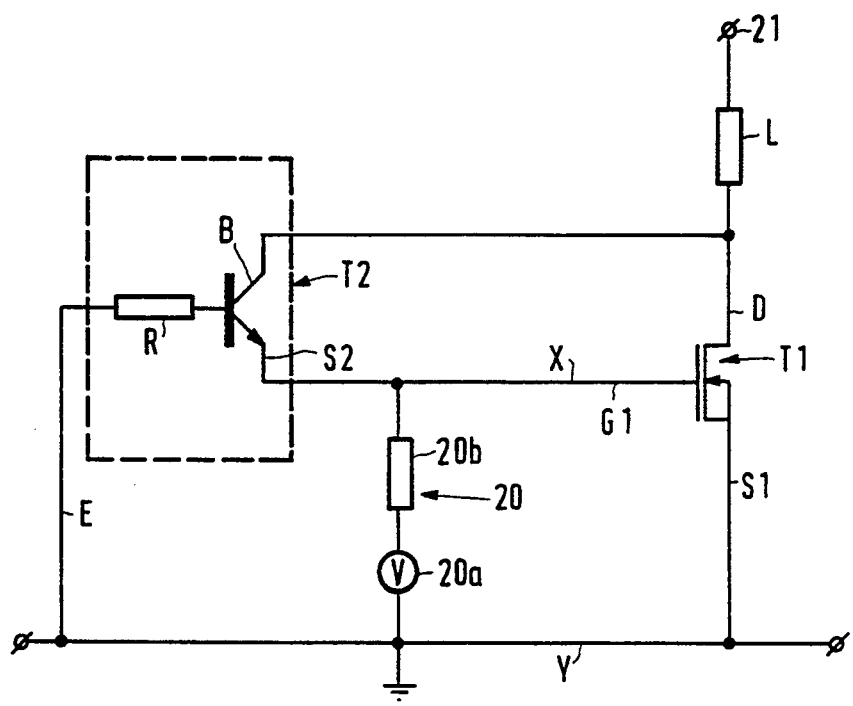
FIG. 3 is an equivalent circuit for a semiconductor component in accordance with the invention.

The second insulated gate IGFET T2 will generally be formed by one single separate device cell 10a. Although the IGFET T2 is shown in FIG. 2 as having a row-like shape when viewed in plan, it may as discussed above be rotationally symmetrical about the insulated gate G2 or the electrode E or have any other suitable shape which allows for separate electrodes E and S2. The IGFET T2 may, as shown in FIG. 2, be placed outside the periphery of the IGFET T1 or could be formed in a recess defined in the IGFET T1 or even centrally within the IGFET T1. Desirably, the second IGFET T2 is placed at the weakest area (that is the area most likely to breakdown) of the first IGFET T1. The actual current carrying capacity of the IGFET T2 will be determined, in general terms, by its area which will be selected as required to be sufficient to enable turn on of the IGFET T1 when the critical voltage is exceeded. Accordingly, the actual size of the IGFET T2 will be determined by the gate voltage required to turn on the IGFET T1 and of course the resistance 20b. As shown in FIG. 3, the IGFET T2 is represented as a parasitic bipolar transistor B having a resistance R in series with its base. The parasitic bipolar transistor B is formed by the first region 4 (collector), the conduction channel defining region 6 (base) and the source region 11b (emitter) while the resistance R is that of the part 6c of the conduction channel defining region 6 beneath the source region 11b.

The common drain electrode D of the first and second IGFETs T1 and T2 is connected in series with an inductive load L, for example a coil, which is connected to a high voltage terminal 21. The insulated gate G1 of the first IGFET T1 is connected to the gate drive circuit 20 which, in this case, comprises a voltage source 20a, in series with a resistance 20b, connected between the connection lines X and Y. The emitter electrode of the parasitic bipolar transistor B is provided by the source electrode S2 of the second IGFET T2 and is connected to the insulated gate G1 by the connection line X.

In operation of a semiconductor component, for example the component 1a shown in FIG. 1, in accordance with the invention, when the appropriate gate voltage is applied via the gate drive circuit 20 to gate G1, the connection line Y is connected to ground, and the appropriate high voltage source is connected to the terminal 21, the first IGFET T1 is rendered conducting so that the power supply is connected to the load L, which may be for example a lamp or a small electric motor. In order to remove the power supply from and so switch off the load L, the gate drive voltage is removed so that the IGFET T1 no longer conducts. However, where, as in the case of a motor coil, the load is highly inductive, the energy stored within the load L causes the voltage at the common drain electrode D to rise rapidly. In a conventional power IGFET, for example a device consisting simply of the IGFET T1, the high voltages induced at the drain electrode D could result in avalanche breakdown at the point of highest electric field within the power IGFET if the drain voltage exceeds a critical voltage $V_c$. In the case of the Trenchfet type of IGFET T1 shown in FIG. 1, the point of highest electric field would generally be at the corners 7a, 7b of the trenches 7 and such avalanche breakdown could result in, for example, irreversible bipolar breakdown or performance degradation due to the injection of hot charge carriers into the gate oxide.

In the semiconductor device 1a illustrated by FIGS. 1 to 3, when the voltage at the common drain electrode D rises under inductive switching and the critical voltage $V_c$ is exceeded, avalanche breakdown will similarly be initiated within the region of highest electric field, that is at the corners 7a and 7b of the trenches. The electric fields within the device 1a cause holes generated at the trench corners to flow towards the nearest ohmic contact to the p conductivity type channel-defining region 6. Holes therefore flow along the conductive paths provided by the region 6 to the source electrode S1 (which is shorted to the region 6) and to the fourth main electrode E. As can be seen clearly from FIG. 1, these conductive paths extend beneath the source regions 11a and 11b.

As mentioned above, the length b of the path beneath the source region 11b from the corner 7b to the fourth main electrode E is designed to be greater than the length a of the path from the corner 7a to the source electrode S1. Because of this, the voltage difference between the corner 7b and the fourth main electrode E will always exceed that between the corner 7a and the source electrode S1. When the voltage difference between the trench corner 7b and the fourth main electrode E exceeds approximately 0.7 volts the pn junction 11'b between the source region 11b and the region 6 will become forward-biassed and the parasitic bipolar transistor B (illustrated in FIG. 3) formed by the drain region 4, the channel-defining region 6 and the source region 11b will turn on. By virtue of the resistance 20b of the gate drive circuit 20, the resulting current flow causes the voltage at the gate electrode G1 of the first IGFET T1 to rise, so turning on the first IGFET T1 and allowing the energy stored within the inductive load L to be dissipated by conduction of the first IGFET T1. This inhibits the possibility of irreversible damage to the first IGFET T1.

As will be appreciated from the above, the mechanism which triggers the protection device formed by the second IGFET T2 is sensitive to, in fact dependent upon, the mechanism which would otherwise cause breakdown of the first IGFET T1 so that the protection device only becomes operational when a critical drain voltage $V_c$ is exceeded which could otherwise potentially damage the power device formed by the first IGFET. The critical voltage $V_c$ which has to be exceeded before the protection device becomes operational can be varied between $BV_{CEO}$ and $BV_{DGO}$ by appropriate adjustment of the relative lengths a and b and can always be adjusted to be acceptably below the voltage at which the first IGFET T1 would otherwise fail.

Figure 4:
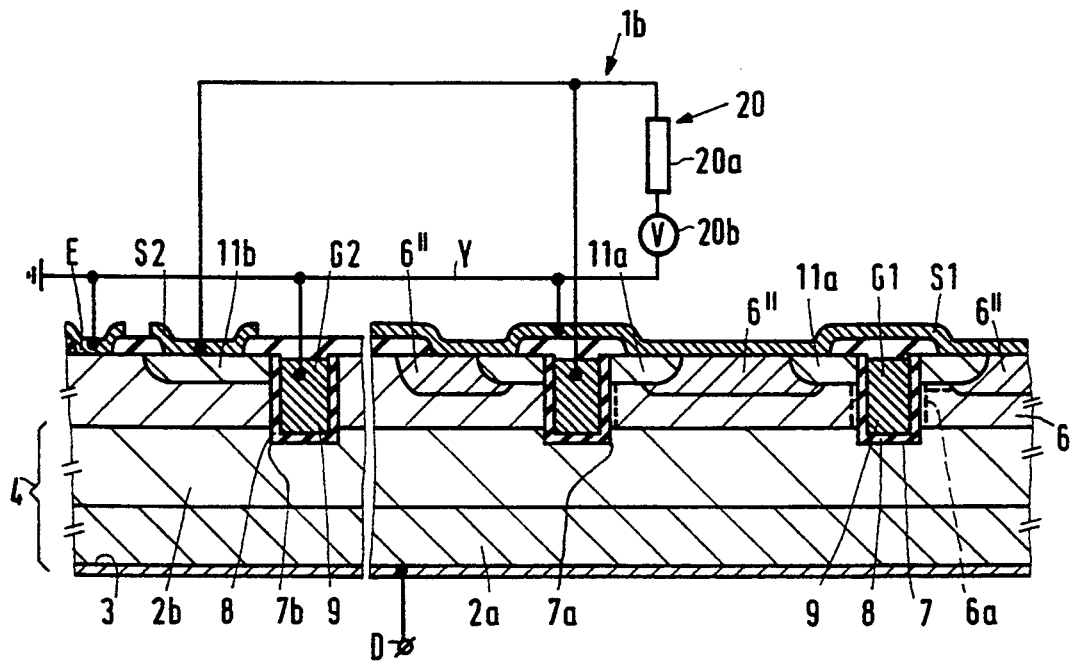
FIG. 4 is a cross-sectional view, part broken away, through part of another embodiment of a semiconductor component in accordance with the invention.

FIG. 4 is a cross-sectional view similar to FIG. 1 for illustrating a modified version 1b of the component shown in FIG. 1. In the example illustrated in FIG. 4, the conduction channel defining region 6 of each device cell 10 of the first IGFET T1 is modified so as to have a central more highly doped subsidiary region 6'', formed by introduction of impurities through an appropriate mask before definition of the trenches 7, which extends to a greater depth than the source region 11a and in addition extends laterally beneath the source region 11a so as to stop just before the conduction channel region 6a. These more highly doped subsidiary regions 6 act to decrease even further the possibility of parasitic bipolar action within the first IGFET T1 by making the conductive path a less resistive than the conductive path b, where the conductive paths a and b and IGFETs T1 and T2 are as defined above and shown in FIG. 1.

The relatively highly doped subsidiary regions 6'' could possibly extend to a depth below that of the trenches so as to move the highest electric field part away from the trench corners 7a into the bulk of the semiconductor body so as further to protect the gate oxide of the first IGFET T1 against breakdown.

In the examples illustrated above, the second IGFET T2 has been made more susceptible to parasitic bipolar action by making the conductive path b longer than the conductive path a and/or by making the conductive path a less resistive than the conductive path b. It may also be possible to make the conductive path b more resistive than the conductive path a by, for example, forming the portion of the region 6 containing the conductive path b as a discrete region which is very long and narrow and therefore more resistive.

In addition it may be possible, at the expense of additional processing steps, to adjust the geometry of the trench of the insulated gate G2 so as to make each trench corner 7b sharper than the trench corners 7a so as to increase the electric field at the trench corner 7b relative to that at the trench corner 7a.

In the above description, the first and second IGFETs T1 and T2 have taken the form of Trenchfet type IGFETs. The present invention may however be applied to other forms of IGFETs where the insulated gate is formed within a groove (that is, for example, so-called VMOS and UMOS technology) and may also be applied to a planar IGFET technology in which the insulated gate is formed on the major surface 5 of the semiconductor body. The following examples illustrate the application of the present invention to this type technology.

Figure 5:
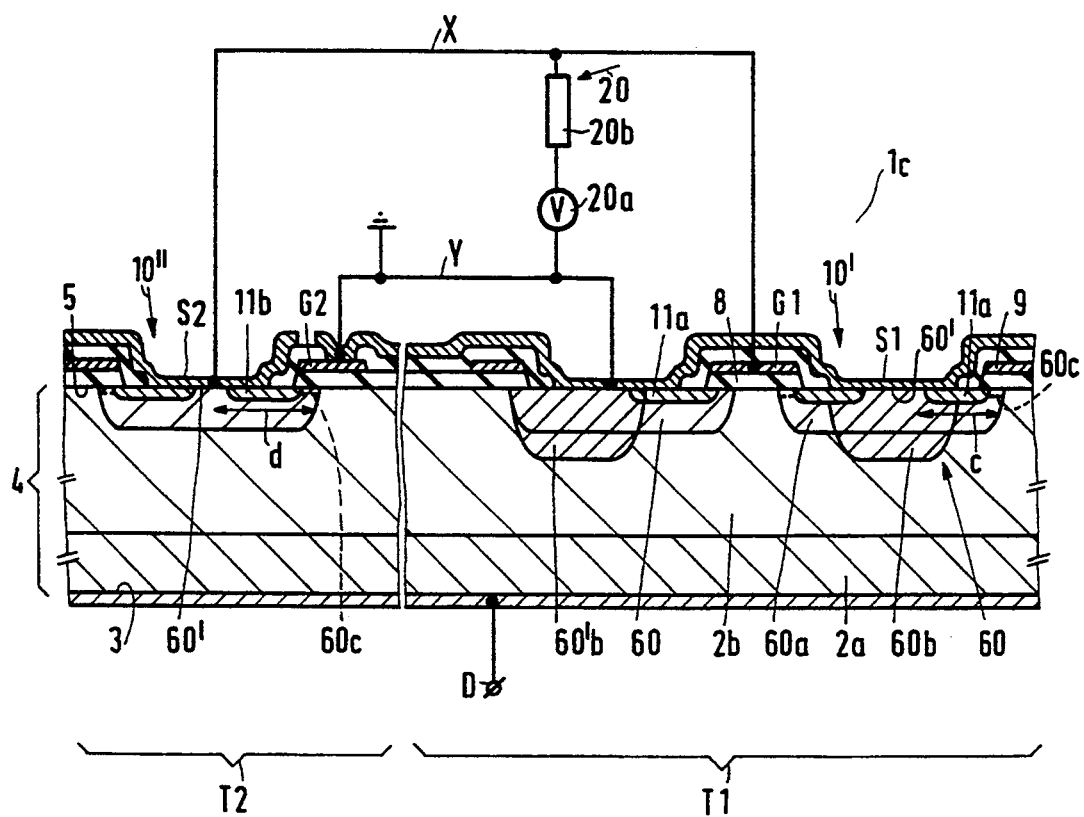
FIG. 5 is a cross-sectional view, part broken away, through part of another embodiment of a semiconductor component in accordance with the invention.

FIG. 5 illustrates a cross-sectional view through part of a semiconductor component 1c in accordance with the invention for which a DMOS type of technology has been adopted for the first and second IGFETs T1 and T2.

As is well understood by those skilled in the art, a DMOSFET differs from a Trenchfet in that the insulated gate is provided on the surface of the semiconductor body and the impurities for forming the source region and at least part of the channel-defining body region are introduced using that surface insulated gate as a mask. As in the case of a power Trenchfet, a power DMOSFET will generally consist of many hundreds of parallel connected device cells arranged in a regular array which may have any desired geometry, for example square or hexagonal. When the power DMOSFET has a square geometry, then it will look similar to FIG. 2 when viewed in plan (with the source metallisation omitted) with the insulated gate following the line of the trench in FIG. 2. Details of the precise technology which is well known in the art will not be given here.

In the example illustrated in FIG. 5, the IGFET T1 device cells 10' each have a body regions 60 with a relatively highly doped relatively deep subsidiary region 60b formed by use of an appropriate mask before definition of the insulated gate G1. Although not shown, each body region 60 may also have a further relatively highly doped subsidiary region which is formed, as discribed in our copending UK Patent Application No. 9207849.2 filed on 9th Apr. 1992, by the introduction of impurities after definition of the insulated gate G1 but while the photosensitive resist mask (not shown) used to define the insulated gate G1 is still in place so that the further relatively highly doped subsidiary region is aligned to the mask but slightly spaced from the edge of the insulated gate structure 10 due to understanding during definition of the insulated gate structure 10. Each body region 60 has a relatively lowly doped subsidiary region 60a which, like the source region 11a, is formed by introduction of impurities after definition of the insulated gate G1 so as to be aligned to the insulated gate structure 10. The conduction channel regions 60c are thus defined at the surface 5 by the respective lateral diffusions beneath the insulated gate of the source and body region defining impurities. A central area 60 ' of each device all 10' is masked from the source-forming impurities to enable the source electrode S1 to short the source regions 11a to the body region 60 to inhibit parasitic bipolar action.

Device cells 10" at the periphery of the IGFET T1 are similar to the remaining active device cells except that the source regions 11a are omitted (or overdoped) from the outer part of the cell and the outer periphery of the cell is formed by a relatively deep relatively highly doped p conductivity region 60b'. Although not shown in FIG. 5, the IGFET T1 may have any suitable field relief edge termination system which may for example be similar to that described for the component shown in FIGS. 1 to 3.

The IGFET T2 has device cells 10" similar to those of the IGFET T1 but is more susceptible to parasitic bipolar action. This may be achieved in several different ways which are described briefly below and more fully in our copending UK Patent Application No. 9207849.2 filed 9th Apr.,1992. Any one or any combination of these techniques for making the IGFET T2 more susceptible to parasitic bipolar action may be adopted.

As illustrated in FIG. 5, the relatively highly doped subsidiary region 60b may be omitted from the device cells 10" and alternatively or additionally the area 60' of the short between the channel defining body region 60 and the source region 11b may be made smaller (or a separate electrode connection provided as in FIG. 1) so as to make the distance d (equivalent to distance b in FIG. 1) greater than the distance c (equivalent to distance a in FIG. 1). As a further possibility the device cells 10" forming the IGFET T2 could be placed at the periphery of the IGFET T1 but have a normal device cell structure that is without the integral guard ring 60b'. Yet another possibility is to space the device cells 10" of the IGFET T2 more widely than the device cells 10' of the IGFET T1 so that the parasitic JFET within the IGFET T1 pinches off before that of the IGFET T2. Other possibilities include altering the geometry of the body region 60 of the device cells 10" of the IGFET T2 (e.g. to make them 'pin cushion' or star shaped) so as to provide sharp corners at which higher electric fields will be generated.

A semiconductor device such as that described with reference to FIG. 5 and adopting DMOS type technology functions in a manner similar to that described above with reference to FIG. 1 except that in this case the point of highest electric field at which avalanche breakdown will be initiated will occur at the pn junction between the body region 60 and the drain drift region 2b and not at a trench corner.

The conductivity types given above may be reversed and the present invention may also be applied to semiconductor materials other than silicon or to devices made from a combination of semiconductor materials.

From reading the present disclosure, other modifications and variations will be apparent to persons skilled in the art. Such modifications and variations may involve other features which are already known in the semiconductor art and which may be used instead of or in addition to features already described herein.

We claim:

1. A semiconductor component comprising first and second insulated gate field effect devices formed within the same semiconductor body, the first and second insulated gate field effect devices having a common first main electrode and means for providing a resistive connection between a second main electrode of the second insulated gate field effect device and the insulated gate of the first insulated gate field effect device, the second insulated gate field effect device comprising means for being susceptible than the first insulated gate field effect device to parasitic bipolar transistor action for causing, when the first and second insulated gate field effect devices are turned off and a voltage exceeding a critical voltage is applied to the common first main electrode, the parasitic bipolar transistor within the second insulated gate field effect device to turn on producing a current for causing, by virtue of the resistive connection between the second main electrode of the second insulated gate field effect device and the insulated gate of the first insulated gate field effect device, the voltage at the insulated gate of the first insulated gate field effect device to alter to cause the first insulated gate field effect device to turn on.

2. A semiconductor component according to claim 1, wherein the first insulated gate field effect device comprises a first region of one conductivity type providing a conductive path to the first main electrode, a second region of the one conductivity type and a third region of the opposite conductivity type separating the first and second regions and defining therebetween a first conduction channel region adjoining the insulated gate of the first insulated gate field effect device, and the second insulated gate field effect device comprises a fourth region of the one conductivity type connected by the resistive connection providing means to the insulated gate of the first insulated gate field effect device and a fifth region of the opposite conductivity type separating the fourth and first regions and defining therebetween a second conduction channel region adjoining the insulated gate of the second insulated gate field effect device, the fifth and fourth regions being arranged such that the second insulated gate field effect device is more susceptible to parasitic bipolar action than the first insulated gate field effect device for causing the parasitic bipolar transistor defined by the first, fourth and fifth regions to turn on when the voltage at the first main electrode exceeds the critical voltage.

3. A semiconductor component according to claim 2, wherein the fifth region provides a more resistive path for charge carriers of the opposite conductivity type than third region.

4. A semiconductor component according to claim 3, wherein the third region is electrically shorted to the second region while the fifth region provides a conductive path to a further electrode.

5. A semiconductor component according to claim 2, wherein the fourth region has a different geometry from that of the second region.

6. A semiconductor component according to claim 2, wherein the resistive path for change carriers of the opposite conductivity type within the fifth region extends beneath the fourth region for a distance greater than the distance extended beneath the second region by the resistive path provided by the third region.

7. A semiconductor component comprising a semiconductor body providing a first insulated gate field effect device having a first region of one conductivity type providing a conductive path to a first main electrode, a second region of the one conductivity type, a third region of the opposite conductivity type separating the first and second regions and defining therebetween a first conduction channel region, a first insulated gate adjoining the first conduction channel region for controlling conduction through the first conduction channel region between the first and second regions and a second main electrode connected to the second region and shorting the second region to the third region remote from the first conduction channel region and a second insulated gate field effect device comprising a fourth region of one conductivity type, means providing a resistive connection between the fourth region and the first insulated gate, a fifth region of the opposite conductivity type separating the fourth and first regions and defining therebetween a second conduction channel region, a second insulated gate adjoining the second conduction channel region and a fourth electrode connected to the fifth region for providing a conductive path for charge carriers of the opposite conductivity type through the fifth region bypassing the fourth region, the resistance of the conductive path through the fifth region being such that when the first and second insulated gate field effect devices are turned off and a voltage exceeding a critical voltage is applied to the first main electrode, the flow of opposite conductivity type charge carriers along the conductive path through the fifth region causes the parasitic bipolar transistor formed by the fourth, fifth and first regions to turn on, producing a current for causing, by virtue of the resistive connection between the second main electrode of the second insulated gate field effect device and the insulated gate of the first insulated gate field effect device, the voltage at the insulated gate of the first field effect device to alter to cause the first insulated gate field effect device to turn on.

8. A semiconductor component according to claim 2, wherein the first insulated gate field effect device comprises a plurality of parallel-connected insulated gate field effect device cells each comprising a second region of the one conductivity type separated from the first region by a third region of the opposite conductivity type defining a conduction channel region adjoining an insulated gate.

9. A semiconductor component according to claim 2, wherein the insulated gates are provided on the walls of trenches extending through the third and fifth regions.

10. A semiconductor component according to claim 9, wherein the third and fifth regions are integrally formed as a continous layer.

11. A semiconductor component according to claim 7, wherein the insulated gates are provided on the walls of trenches extending through the third and fifth regions, respectively, and the fourth region extends laterally beyond the second insulated gate for a distance greater than the distance for which the second region extends laterally beyond the first insulated gate so that the resistance of the conductive path through the fifth region to the fourth main electrode is greater than that of the conductive path through the third region to the second main electrode.

12. A semiconductor component according to claim 1, wherein the means providing the resistive connection between the second main electrode of the second insulated gate field effect device and the insulated gate of the first insulated gate field effect device comprises a gate drive arrangement for the insulated gate of the first insulated gate field effect device.

* * * * *